(12) United States Patent
Ott et al.

(10) Patent No.: US 10,955,462 B2
(45) Date of Patent: Mar. 23, 2021

(54) APPARATUS AND METHOD FOR FREQUENCY CHARACTERIZATION OF AN ELECTRONIC SYSTEM

(71) Applicant: Fraunhofer-Gesellschaft zur Foerderung der angewandten Forschung e. V., Munich (DE)

(72) Inventors: Leopold Ott, Nuremberg (DE); Fabian Bodensteiner, Erlangen (DE); Bernd Wunder, Erlangen (DE)

(73) Assignee: Fraunhofer-Gesellschaft zur Foerderung der angewandten Forschung e. v., Munich (DE)

( * ) Notice: Subject to any disclaimer, the term of this patent is extended or adjusted under 35 U.S.C. 154(b) by 203 days.

(21) Appl. No.: 16/019,638

(22) Filed: Jun. 27, 2018

(65) Prior Publication Data

US 2019/0004108 A1  Jan. 3, 2019

(30) Foreign Application Priority Data

Jun. 28, 2017 (EP) .................................... 17178368

(51) Int. Cl.
*G01R 31/28* (2006.01)
*G01R 31/389* (2019.01)
*H02M 3/158* (2006.01)

(52) U.S. Cl.
CPC ....... *G01R 31/2837* (2013.01); *G01R 31/389* (2019.01); *H02M 3/158* (2013.01)

(58) Field of Classification Search
CPC .................................................. G01R 31/002
See application file for complete search history.

(56) References Cited

U.S. PATENT DOCUMENTS 5,689,407 A * 11/1997 Marinus ............ H02M 3/33523
                                                    363/21.15
6,160,697 A * 12/2000 Edel ...................... G01R 15/185
                                                    361/143

(Continued)

FOREIGN PATENT DOCUMENTS

DE     102008060385 A1    4/2010
EP         1533624 A1    5/2005

OTHER PUBLICATIONS

Y. Panov und M. Jovanovic, „Practical Issues of Input/Output Impedance Measurements in Switching Power Supplies and Application of Measured Data to Stability Analysis, in Twentieth Annuel IEEE Applied Power Electronics Conference and Exposition, Austin, 2005.

(Continued)

*Primary Examiner* — Tung X Nguyen
(74) *Attorney, Agent, or Firm* — 2SPL Patent Attorneys PartG mbB; Yong Beom Hwang (57) ABSTRACT

An apparatus for a frequency characterization of an electronic system is provided. The apparatus includes two terminals configured to couple with the electronic system. Further, the apparatus includes a control circuit configured to generate a test signal. The apparatus further includes a coupling circuit including an adjustable impedance and a switch which are coupled in series. End nodes of the coupling circuit are coupled to the two terminals. The switch is configured here to electrically couple the two terminals with each other based on the test signal.

13 Claims, 3 Drawing Sheets

(56) References Cited

U.S. PATENT DOCUMENTS

| | | | |
|---|---|---|---|
| 6,385,547 B1* | 5/2002 | Bogli | G01R 15/04 324/600 |
| 7,675,293 B2 | 3/2010 | Christophersen et al. | |
| 2017/0003355 A1 | 1/2017 | Ranieri et al. | |

OTHER PUBLICATIONS

L. Ott, V. Han, 0. Stephani, J. Kaiser, B. Wunder, M. Maerz und K. Rykov, „Modelling and Measuring Complex Impedances of Power Electronic Converters for Stability Assessment of Low-Voltage DC-Grids, in Proceedings IEEE First International Conference on DC Microgrids, Atlanta, 2015.

R. Button und A. Brush, „Stability Testing and Analysis of a PMAD DC Test Bed for the Space Station Freedom, NASA Technical Memorandum 105846, Cleveland 1992.

A. Riccobono, Stabilizing Controller Design for a DC Power Distribution System Using a Passivity-Based Stability Criterion, Columbia: College of Engineering and Computing, University of South Carolina, 2013.

A. Riccobono, E. Liegmann, A. Monti, F. Castelli Dezza, J. Siegers und E. Santi, „Online Wideband Identification of Three-Phase AC Power Grid Impedances using an Existing Grid-tied Power Electronic Inverter, in IEEE 17th Workshop on Control and Modelling for Power Electronics, Trondheim, 2016.

Shirazi J. Morroni, A. Dolgov, R. Zane und D. Maksimovic, „Integration of Frequency Response Measurement Capabilities in Digital Controliers for DC-DC Converters, in IEEE Transactions on Power Elearonics. 2008.

F. Haemmerle; "Capacitor ESR Measurement," 2014. [Online]. Availabie—https://wvvvvomicron-lab.conVbode-100/application-notes-knovv.hovv/applicationnotes/capacitor-esr-measurement.html. [Zugriff am Jan. 16, 2017).

* cited by examiner

APPARATUS AND METHOD FOR FREQUENCY CHARACTERIZATION OF AN ELECTRONIC SYSTEM

TECHNICAL FIELD

Embodiments relate to frequency characterization of electronic systems. In particular, embodiments relate to an apparatus and a method for frequency characterization of an electronic system.

BACKGROUND

For the characterization of active and passive electronic systems, frequently zirp signals (sinusoidal signals with an alternating frequency) are used which are coupled into a measurement set-up either capacitively or inductively, depending on the application. The zirp signals are generated with the help of a signal generator, which is in most cases part of a network analyzer which is also used for evaluating the measurement signals. Such systems are e.g. Proposed in Y. Panov et al: "Practical Issues of Input/Output Impedance Measurements in Switching Power Supplies and Application of Measured Data to Stability Analysis" in Twentieth Annual IEEE Applied Power Electronics Conference and Exposition, Austin, 2005 and also in L. Ott et al: "Modelling and Measuring Complex Impedances of Power Electronic Converters for Stability Assessment of Low-Voltage DC-Grids" in Proceedings IEEE First International Conference on DC Microgrids, Atlanta 2015.

In the above mentioned methods, the bandwidth of the measurement receiver for recording the measurements may be chosen clearly lower than the current frequency of the Zirp signal, so that the recording duration, in particular for low frequency ranges, is very long (e.g. in a range of several minutes). The capacitive and/or inductive coupling of the zirp signals further restricts the aforementioned methods to DC-based applications (DC=direct current). With an inductive coupling of the measurement signal, the measurement circuit has further to be disconnected to incorporate an inductive coupling member into the measurement set-up. With a capacitive coupling, due to the necessary coupling capacitor, no safe galvanic separation of measurement equipment and measurement set-up is possible, so that additional inductive transmission members are necessary for insulation purposes. Consequently, a high expenditure regarding the required hardware results. For both types of coupling, further the dimensioning of the passive circuit components for coupling with respect to the desired bandwidth is to be adapted to the specific application case, so that these methods may not be used universally. When measuring arrangements of higher power levels, the available signal levels of network analyzers are not sufficient any more to guarantee a sufficient interference distance. Consequently, external power amplifiers are required which increases both expenses regarding the required hardware and also costs.

Complex impedances of power-electronic systems may also be measured using an individual power-electronic converter which injects an alternating-frequency excitation signal into the distribution network to be examined and records the response of the system. The alternating-frequency signal is here either overplayed onto the current or voltage nominal value or directly onto the duty cycle signal of the used converter. Such systems are e.g. proposed in R. Button et al: "Stability Testing and Analysis of a PMAD DC Test Bed for the Space Station Freedom" NASA Technical Memorandum 105846, Cleveland, 1992 or also in A. Riccobono: "Stabilizing Controller Design for a DC Power Distribution System Using a Passivity-Based Stability Criterion", Columbia: College of Engineering and Computing, University of South Carolina, 2013.

With the mentioned methods, an additional power-electronic component has to be introduced into the measurement circuit so that the operating point and consequently also the frequency behavior of the complete measurement circuit may be distorted. The resolvable frequency range is restricted by the switching frequency and/or corner frequency of the output filter of the injection converter. An expansion of the resolvable frequency range is thus connected with high development expenses. As an additional power-electronic component is required, also the costs of the method are high.

There is thus a demand to provide a possibility for frequency characterization of electronic systems which at least avoids the aforementioned problems.

SUMMARY

This is enabled by embodiments of an apparatus for frequency characterization of an electronic system. The apparatus includes two terminals configured to couple with the electronic system. Further, the apparatus comprises a control circuit configured to generate a test signal. The apparatus further comprises a coupling circuit including an adjustable impedance and a switch which are coupled in series. End nodes of the coupling circuit are coupled to the two terminals. The switch is configured here to electrically couple the two terminals with each other based on the test signal.

Further embodiments relate to a DC-DC converter. The DC-DC converter comprises a voltage converter circuit configured to convert an input voltage with a first voltage level into an output voltage with a different second voltage level. Further, the DC-DC converter comprises above apparatus for frequency characterization of an electronic system. The two terminals of the apparatus are coupled to input terminals of the DC-DC converter which receive the input voltage or to output terminals of the DC-DC converter which output the output voltage.

Embodiments further relate to a method for frequency characterization of an electronic system. The method includes coupling a test signal into the electronic system using the above apparatus for frequency characterization. Further, the method comprises measuring a first current and/or a first voltage at the electronic system to generate at least one measurement result. Further, the method comprises cross-correlating the at least one measurement result with the test signal to generate a first correlation result. The method further comprises Fourier-transforming the first correlation result to generate a first course signal representing a frequency course of the current and/or the voltage.

BRIEF DESCRIPTION OF THE FIGURES

Embodiments are explained in more detail with reference to the accompanying Figures, in which:

FIG. 5 shows an embodiment of a DC/DC converter; and.

DESCRIPTION

Various embodiments will now be described with reference to the accompanying drawings in which some example embodiments are illustrated. In the Figures, the thicknesses of lines, layers and/or regions may be exaggerated for clarity.

Like numbers refer to like or similar components throughout the following description of the included figures, which merely show some exemplary embodiments. Moreover, summarizing reference signs will be used for components and objects which occur several times in one embodiment or in one Figure but are described at the same time with respect to one or several features. Components and objects described with like or summarizing reference signs may be implemented alike or also differently, if applicable, with respect to one or more or all the features, e.g. their dimensioning, unless explicitly or implicitly stated otherwise in the description.

Although embodiments may be modified and changed in different ways, embodiments are illustrated as examples in the Figures and are described herein in detail. It is to be noted, however, that it is not intended to restrict embodiments to the respectively disclosed forms but that embodiments rather ought to cover any functional and/or structural modifications, equivalents and alternatives which are within the scope of the invention. Same reference numerals designate same or similar elements throughout the complete description of the figures.

It is noted, that an element which is referred to a being "connected" or "coupled" to another element, may be directly connected or coupled to the other element or that intervening elements may be present.

The terminology used herein only serves for the description of specific embodiments and should not limit the embodiments. As used herein, the singular form such as "a," "an" and "the" also include the plural forms, as long as the context does not indicate otherwise. It will be further understood that the terms e.g. "comprises," "comprising," "includes" and/or "including," as used herein, specify the presence of the stated features, integers, steps, operations, elements and/or components, but do not preclude the presence or addition of one and/or more other features, integers, steps, operations, elements, components and/or any group thereof.

Unless otherwise defined, all terms (including technical and scientific terms) are used herein in their ordinary meaning of the art to which the examples belong and which are given to same by a person of ordinary skill in the art. It is further clarified that terms like e.g. those defined in generally used dictionaries are to be interpreted to have the meaning consistent with the meaning in the context of relevant technology, as long as it is not expressly defined otherwise herein.

Figure 1:
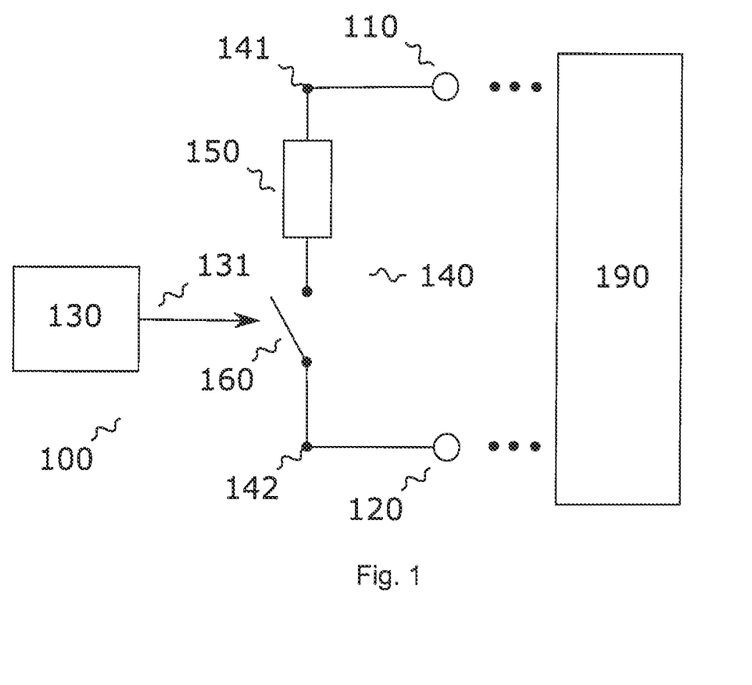
FIG. 1 shows an embodiment of an apparatus for frequency characterization of an electronic system.

FIG. 1 shows an apparatus 100 for frequency characterization of an electronic system 190. The apparatus 100 comprises two terminals 110 and 120 configured to couple with the electronic system 190. Further, the apparatus 100 comprises a control circuit 130 configured to generate a test signal 131. The apparatus 100 further comprises a coupling circuit 140 including an adjustable impedance 150 and a switch 160 which are coupled in series. End nodes 141 and 142 of the coupling circuit 140 are coupled to the two terminals 110 and 120. The switch 160 is configured here to electrically couple the two terminals 110 and 120 based on the test signal 131.

By coupling the two terminals 110 and 120 according to the test signal 131, the electronic system 190 is excited, i.e. the test signal 131 is coupled into the electronic system 190. The apparatus 100 thus enables a non-invasive coupling of the test signal 131 into the electronic system 190 without statically influencing the operating point of the electronic system 190 and consequently without a distortion of its frequency behavior. Further, the amplitude of excitation, i.e. the excitation level, may easily be adjusted via the adjustable impedance. The apparatus 100 may be adapted to the characteristics of the electronic system for coupling the test signal 131 into an electronic system.

The terminals 110 and 120 may here be any suitable type of terminals and/or connecting elements to couple the apparatus 100 to an electronic system 190. For example, the terminals 110 and 120 may be plugs, sockets, clamps, wires, soldered joints etc.

The control circuit 130 may be any electronic assembly which may generate the test signal 131 in a controlled manner. The test signal 131 may be any analog or digital signal which is suitable to excite the electronic system 190. The test signal 131 may e.g. be a square signal or a pseudo-random binary sequence (PRBS). The control circuit 130 may thus e.g. include an oscillator (e.g. crystal oscillator), a rectangle generator (e.g. a stable multivibrator or Schmitt trigger) and/or a random generator. The control circuit may also comprise components like e.g. a processor, Central Processing Unit (CPU), an Application-Specific Integrated Circuit (ASIC), an Integrated Circuit (IC), a System on Chip (SOC), a programmable logics element or a Field Programmable Gate Array (FPGA) comprising a microprocessor, on which software for generating and/or controlling the generation of the test signal 131 is executed.

The adjustable impedance 150 may be any device comprising an adjustable impedance value (e.g. potentiometer or linearly operated power transistor). As already indicated above, via the adjustable impedance 150 the amplitude of the excitation introduced into the electronic system 190 may be set variably. The impedance value of the adjustable impedance 150 may here be determined based on an operating voltage and/or an operating current of the electronic system 190. For example, the control circuit 130 may further be configured to set the impedance value of the adjustable impedance 150 depending on the operating voltage and/or the operating current of the electronic system 190. This way, the coupling of the test signal 131 may be adapted to the characteristics of the electronic system 190.

The switch 160 is an assembly which establishes or disconnects an electrically conducting connection by means of two electrically conducting materials or a semiconductor device. For example, the switch 160 may be a transistor. The apparatus 100 may further include a driver which is configured to control the conductivity of the transistor based on the test signal 131.

Further, the device may also include a measurement circuit (not illustrated). For example, the measurement circuit may be configured to generate a first measurement signal representing the current through the coupling circuit 140 and/or a second measurement signal representing the voltage across the coupling circuit 140. In other words: The apparatus 100 may optionally also include means for measuring the impulse responses of the electronic system 190. The first and the second measurement signal may here be both digital and also analog signals.

The measurement may here be broad banded. When the test signal 131 is a PRBS, the measurement bandwidth of the measurement circuit may e.g. be up to 50% of a sampling frequency of the test signal 131. Accordingly, the necessary time duration for recording the impulse responses of the electronic system 190 may be substantially shortened. In particular when using square-wave signals or pseudo-random binary sequences as a test signal 131, as compared to zirp signals, the measurement bandwidth is not subject to a bandwidth limitation. This allows a fast evaluation of the impulse responses of the electronic system 190.

For example, the control circuit 130 may further be configured, based on the first measurement signal and the test signal 131, to generate a first signal which represents a frequency course of the current through the coupling circuit 140. Alternatively or additionally, the control circuit 130 may further be configured, based on the second measurement signal and the test signal 131, to generate a second signal which represents a frequency course of the voltage across the coupling circuit 140. The frequency courses of voltage and current represent frequency-dependent characteristics of the electronic system 190. Additionally, from the frequency courses of voltage and current further frequency dependent characteristics of the electronic system 190 may be derived. In order to generate the first signal and/or the second signal, the control circuit 130 may e.g. be configured to cross-correlate the first signal and/or the second measurement signal with the test signal 131.

To enable a most optimal resolution in the frequency range, the measurement circuit may further be configured to generate the first measurement signal and/or the second measurement signal synchronous to the test signal 131. I.e., the detection of the measurement values for current and/or voltage may be synchronous to the test signal 131.

Set-up related limitations of the measurable frequency range e.g. due to the switching frequency of an injection converter, filter stages or passive coupling members may be prevented by the apparatus 100. If a PRBS is used as a test signal 131, the measurable frequency range may e.g. be determined by the clock frequency of the signal and the number of bits used for the sequence. If a square-wave signal is used as a test signal 131, the measurable frequency range may be set by the length of the square-wave window. Adapting the frequency resolution to the electronic system to be examined is thus possible adaptively in both cases, i.e. without changing the hardware set-up.

Figure 2:
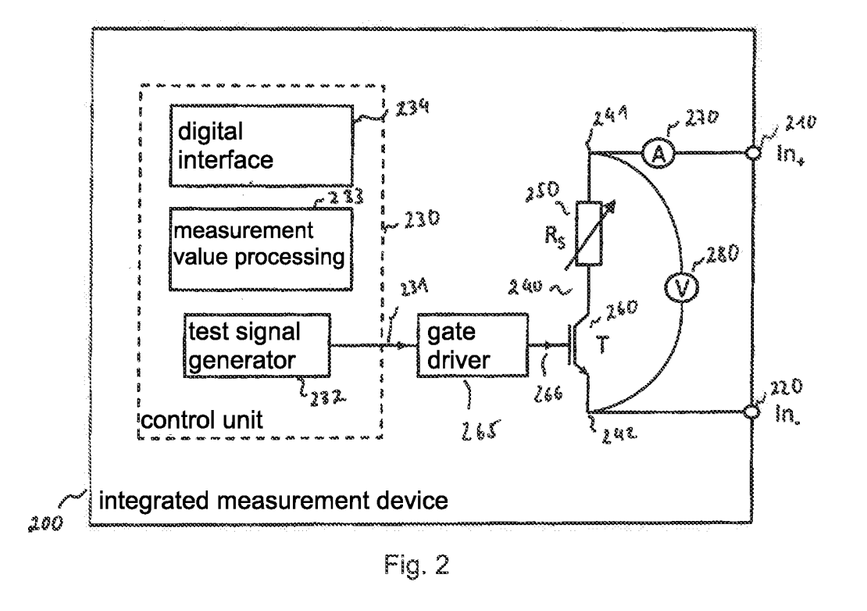
FIG. 2 shows a further embodiment of an apparatus for frequency characterization of an electronic system.

In FIG. 2, a further apparatus 200 for frequency characterization of electronic systems according to the proposed architecture is illustrated.

The apparatus 200 again comprises two terminals 210 and 220 configured to couple the apparatus 200 with the electronic system (not illustrated).

The control circuit 230 of the apparatus 200 comprises a test signal generator 232 to generate a test signal 231. Depending on the desired excitation amplitude, the test signal 231 may e.g. comprise one or several periods of a PRBS or square-wave signal for a broad-banded excitation of frequency portions.

Coupling the test signal 231 into the electronic system to be examined is done via a coupling circuit 240. The coupling circuit 240 comprises an adjustable impedance 250 (i.e. a limiting resistor) and a switch in the form of a transistor 260, i.e. a semiconductor switch (with a corresponding voltage sustaining capability and current carrying capacity). The impedance 250 and the transistor 260 are coupled in series. End nodes 241 and 242 of the coupling circuit 240 are coupled to the two terminals 210 and 220. Via the transistor 260, the two terminals 210 and 220 are electrically coupled to one another based on the test signal 230. In this respect, the apparatus 200 further comprises a driver 265 which receives the test signal 231 an applies a control signal 266 to the gate terminal of the transistor 260 based thereon to thus control the conductivity of the transistor 260 based on the test signal 231.

The test signal 231 is digitally or analogously generated in the control circuit 230 and determines the length of switch-on and/or switch-off times of transistor 260 during a measurement period. For example, the test signal 231 may be transferred to the driver 265 as a logical input signal.

As already indicated above, via the adjustable impedance 250 the excitation amplitude may be set variably. For example, the adjustable impedance 250 may be a potentiometer or a linearly operable power transistor. Adjusting the impedance 250 may e.g. take place depending on the operating point variables for voltage and current of the arrangement to be examined.

Set-up related limitations of the measurable frequency range e.g. due to the switching frequency of an injection converter, filter stages or passive coupling members may be prevented by the apparatus 200. As already indicated above, the measurable frequency range for a PRBS test signal may be determined by the clock frequency of the signal and the number of bits used for the sequence. If a square-wave test signal is used, the measurable frequency range may be set by the length of the square-wave window. Adapting the frequency resolution to the electronic system to be examined is thus possible adaptively in both cases, i.e. without changing the hardware set-up.

Coupling the test signal 231 into the arrangement to be measured is thus executed completely different as compared to conventional inductive or capacitive coupling circuits or also separate power-electronic converters.

The apparatus 200 thus enables a non-invasive coupling of the test signal 231 into an electronic system without statically influencing the operating point of the electronic system and consequently without a distortion of its frequency behavior. Further, via the adjustable impedance 250, the test signal level may easily be adjusted. Thus, with little hardware expense and consequently low costs the test signal 231 may be coupled into an electronic system.

The apparatus 200 additionally comprises a measurement circuit with a first measurement channel 270 configured to generate a first measurement signal representing the current through the coupling circuit 240 and a second measurement channel 280 configured to generate a second measurement signal representing the voltage across the coupling circuit 240.

The two measurement channels 270 and 280 may be configured broad-banded. For example, the measurement bandwidth of the measurement channels 270 and 280 may be up to 50% of a sampling frequency of the test signal 231 when the test signal 231 is a PRBS signal. The detection of the measurement values may be synchronized with coupling the test signal 231 into the measurement circuit (i.e. the electronic system) to acquire an improved resolution in the frequency range.

The control circuit 230 may now also process the two measurement signals, i.e. the current and the voltage signal. For example, the two measurement signals may be cross-correlated with the test signal 231 by a measurement value processing circuit 233 of the control circuit 230 and subsequently be transformed into the frequency range by means of a (discrete) Fourier transformation. From the thus acquired frequency courses for current and voltage, the required frequency characteristics of the examined electronic system may be received. For example, this way a complex impedance of the examined electronic system may be determined.

Optionally, the two measurement signals and also the signals representing the current and/or voltage course across the frequency may be transferred to external devices (e.g. computer, laptop, radio transmitter, etc.) via an interface 234. The interface 234 may both be a wirebonded and also a wireless interface. The interface 234 may also be a digital interface, as indicated in FIG. 2, or an analogue interface. Via the interface, e.g. also detailed settings for the test signal 231 (e.g. number of bits used for the PRBS signal, length of the square pulses or number of measurement periods to be coupled in) or the sampling frequency of the measurement channels 270 and 280 may be set. Alternatively, the apparatus 200 may also comprise corresponding input means (e.g. buttons, touchscreen), so that a user may execute corresponding inputs at the apparatus 200 himself.

Using the apparatus 200 a plurality of measurement and testing tasks may be executed both on active and also passive electronic components (systems). In the following, in connection with FIGS. 3 to 5 some exemplary ways of use of an apparatus for frequency characterization of electronic systems according to the proposed architecture and/or according to one or more embodiments described above are illustrated.

Figure 3:
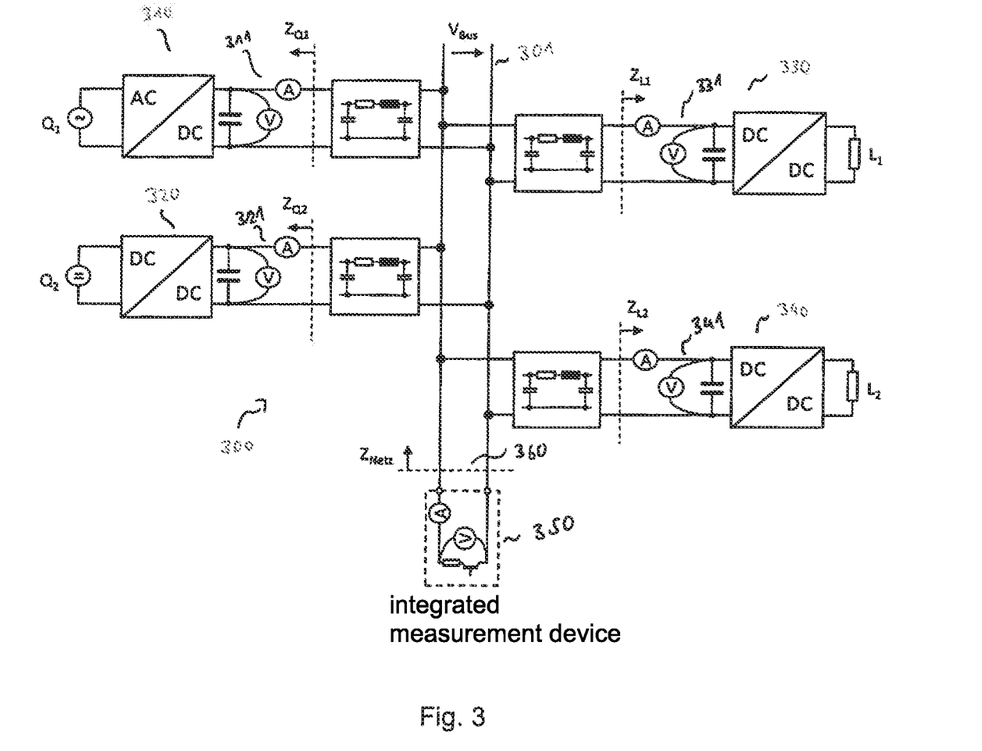
FIG. 3 shows the use of an apparatus for frequency characterization of an electronic system in a direct voltage distribution network.

FIG. 3 shows a DC voltage network 300 including four users 310, 320, 330 and 340. The four users 310, 320, 330 and 340 are attached to a central busbar 301 of the star-shaped DC voltage network 300.

An apparatus 350 for frequency characterization of electronic systems according to the proposed architecture and/or according to one or more embodiments described above may be attached to the DC voltage network in any position. As indicated in FIG. 3, the apparatus 350 may e.g. be coupled to the central busbar 301.

Depending on the positioning of the measurement locations for current and voltage within the DC voltage network 300, using the illustrated setup e.g. different complex impedance courses may be determined. If the internal measurement channels of the apparatus 300 are used, i.e. the apparatus 300 also serves as a measurement device, determining the complete resulting network impedance $Z_{Netz}$ at the connecting point 360 of the apparatus 350 is possible. The network impedance $Z_{Netz}$ results from the impedances of all connected users 310, 320, 330 and 340 in combination with the cable impedances.

For example, according to the standards represented above in connection with FIG. 1 and FIG. 2, the apparatus 350 may cross-correlate the measured signals for current and voltage with the coupled-in test signal and execute a Fourier transformation to determine the frequency-dependent courses for current and voltage.

As indicated in FIG. 3, by means of external measurement locations (measurement circuits) 311, 321, 331, 341 for current and/or voltage also the complex impedances of the individually connected users 310, 320, 330 and/or 340 may be measured and/or determined under any operating points according to the above principles. For example, the complex impedance course $Z_{Q1}$ of user 310 (which represents a source) may be measured and/or determined by means of the external measurement location 311 which is directly coupled to the terminals of the user 310, according to the above principles. This way, e.g. the current and/or voltage measured at the terminals of the user 310 may be cross-correlated with the test signal coupled in by the device 350 and subsequently be Fourier transformed. From the frequency courses of current and voltage determined this way only the impedance course $Z_{Q1}$ may be determined.

As indicated in FIG. 3, the apparatus 350 may further comprise a measurement circuit for measuring the current through the coupling circuit of the apparatus 350 and the voltage across the coupling circuit of the apparatus 350.

The short measurement and/or evaluation duration of the proposed architecture (e.g. some seconds) may also enable checking the characteristics of electronic assemblies and/or functional tests. For example, this way the electronic assemblies may be tested in automated units of mass production for electronic assemblies. This is illustrated exemplarily in FIG. 4 for a π filter structure 410.

Figure 4:
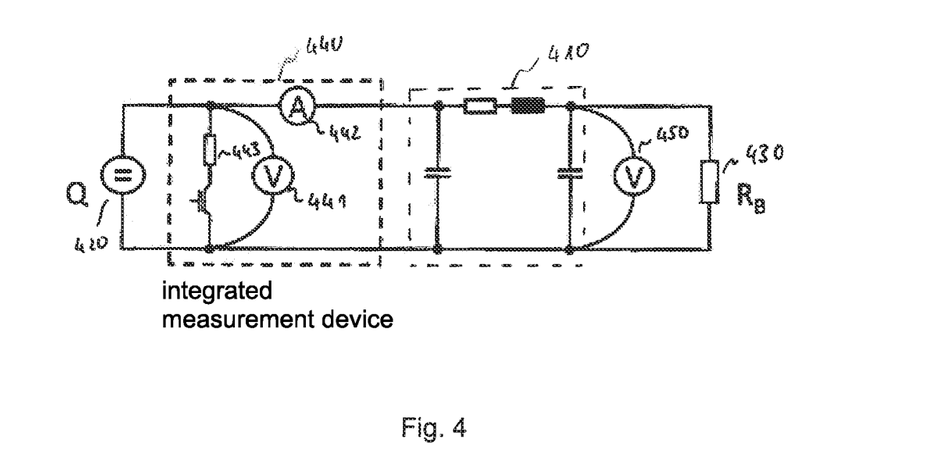
FIG. 4 shows the use of an apparatus for frequency characterization of an electronic system for measuring a filter.

Similar to the above example of measuring complex impedances in a distribution network, also in the example shown in FIG. 4 the determination of different characteristics of the examined electronic component (here the it filter structure 410) is possible.

In the example shown in FIG. 4, a voltage source 420 and a resistor 430 are coupled to the π filter structure 410 to stress same with a fixed operating point. An apparatus 440 for frequency characterization of electronic systems according to the proposed architecture and/or according to one or more embodiments described above is further coupled to the it filter structure 410. The measurement circuit of the apparatus 440 with its measurement channels 441 and 442 for current and/or voltage at and/or across the coupling circuit 443 may determine the input impedance of the it filter structure 410 according to the above described principles. If, instead of the internal current measurement channel 442 at the output of the π filter structure 410, e.g. a second external measurement circuit 450 is used for voltage measurement, the transfer function of the π filter structure 410 may be measured. The measurement of the measurement circuit 450 may here again be synchronous to the test signal coupled in by the apparatus 440.

The use of apparatuses for frequency characterization of electronic systems according to the proposed architecture and/or according to one or more embodiments described above is not restricted to the measurement of complex frequency characteristics of power-electronic systems, however. This way, e.g. also the complex impedance courses of photovoltaic strings or battery packs may be measured with a measurement setup as shown in FIG. 4. In particular with applications which are highly sensitive with respect to the current operating point, the measurement according to the proposed architecture may comprise substantial advantages compared to conventional approaches due to its short measurement duration. By using zirp signals for frequency characterization in the conventional approaches, it may not always be guaranteed that the arrangement to be measured may remain in a constant operating point.

Figure 5:
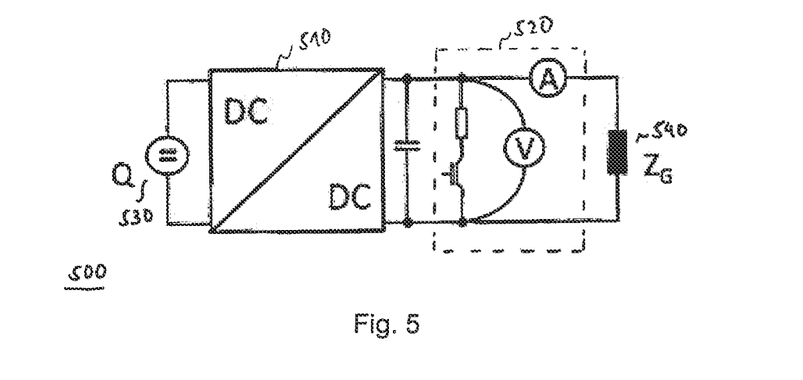

A further use of apparatuses for frequency characterization of electronic systems according to the proposed architecture and/or according to one or more embodiments described above is shown in FIG. 5. FIG. 5 shows a DC-DC converter 500.

The DC-DC converter 500 comprises a voltage converter circuit 510 configured to convert an input voltage with a first voltage level (e.g. 1 V, 2 V or 6 V) into an output voltage with a different second voltage level (e.g. 12 V, 24 V or 48 V). Further, the DC-DC converter 500 comprises an apparatus 520 for frequency characterization of an electronic system according to the proposed architecture and/or according to one or more of the above described embodiments. The two terminals of the apparatus 520 may be coupled both to input terminals of the DC-DC converter 500 which receive the input voltage or, as shown in FIG. 5, to output terminals of the DC-DC converter 500 which output the output voltage.

Accordingly, e.g. either the complex impedance of the voltage source 530 which provides the input voltage for the DC-DC converter 500 or the load 540 to which the DC-DC converter 500 outputs the output voltage may be determined. In the example shown in FIG. 5, the load 540 is a connected DC voltage network, so that the complex impedance $Z_G$ of the DC voltage network may be determined.

The recorded measurement values may be used within the DC-DC converter 500 e.g. for the adaptation of control parameters or for safety functions by detecting error cases in the DC voltage network.

Accordingly, the apparatus 520 may be configured to output an impedance signal representing an impedance at the input terminals or the output terminals of the DC-DC converter 500. The voltage converter circuit 510 may then be configured to set a control parameter based on the impedance signal and/or execute a safety routine based on the impedance signal.

Figure 6:
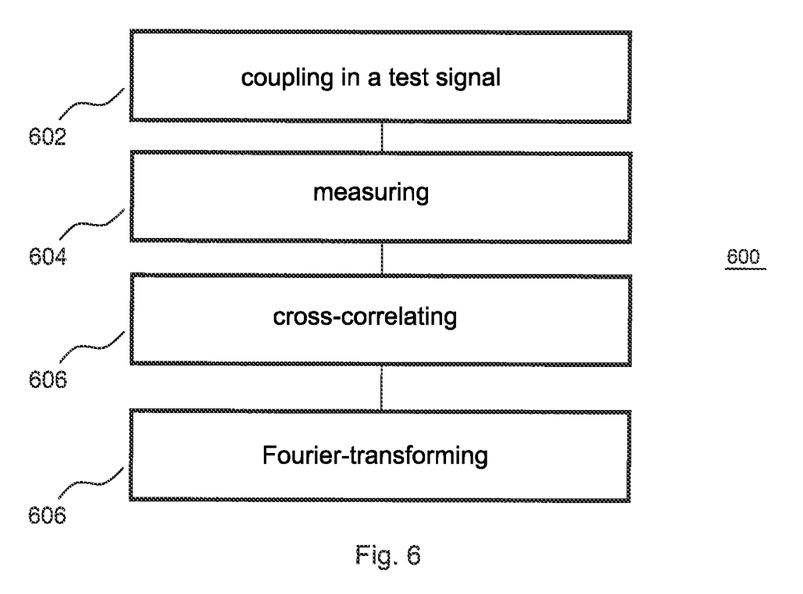
FIG. 6 shows a flow chart of an embodiment of a method for a frequency characterization of an electronic system.

The basics of frequency characterization of an electronic system according to the above described embodiments are again summarized in FIG. 6 which illustrates a flow chart of a method 600 for frequency characterization of an electronic system.

The method 600 includes coupling 602 a test signal into the electronic system using an apparatus for frequency characterization according to the proposed architecture and/or according to one or more of the above described embodiments. Further, the method 600 comprises measuring 604 a first current and/or a first voltage at the electronic system to generate at least one measurement result. Further, the method 600 comprises cross-correlating 606 the at least one measurement result with the test signal to generate a first correlation result. The method further 600 comprises Fourier-transforming 608 the first correlation result to generate a first course signal representing a frequency course of the current and/or the voltage.

The use of an apparatus for frequency characterization according to the proposed architecture and/or according to one or more of the above described embodiments enables a non-invasive coupling of the test signal into the electronic system without statically influencing the operating point of the electronic system and thus without a distortion of its frequency behavior. Limitations of the measurable frequency range with respect to the first current and/or the first voltage due to the setup may also be prevented by the apparatus 100. Accordingly, a fast evaluation of the impulse responses of the electronic system is enabled.

As described above, the method 600 may further comprise measuring a second current and/or a second voltage at the electronic system to generate at least a second measurement result. Likewise, the method 600 may further comprise cross-correlating the at least one second measurement result with the test signal to generate a second correlation result. The method 600 may further comprise Fourier-transforming the second correlation result to generate a second course signal representing a frequency course of the second current and/or the second voltage.

The first current and/or the first voltage may here be measured using one of the above apparatuses for frequency characterization, as described above.

For example, the first current and/or the first voltage are measured with a measurement bandwidth of up to 50% of a sampling frequency of the test signal when the test signal is a PRBS.

More details and aspects of the method 600 are described above in connection with one or more embodiments (e.g. FIGS. 1 and 2). The method 600 may include one or more optional features according to one or more of the above described embodiments.

As already indicated above, the method 600 may enable a short duration of measurement periods (e.g. in a range of several 100 ms), which is advantageous in particular with respect to the determination of frequency characteristics of systems with a high sensibility toward the current operating point (e.g. battery system or photovoltaic unit). Also the possibility of a fast evaluation of the measurement results (e.g. within a few seconds) offers great advantages both in practical engineering development work and also the automatic manufacturing of electronic systems.

While, in case of conventional methods for determining frequency characteristics of a systems with the help of zirp signals, the passive coupling systems have to be comprehensively adapted for adapting the excitation amplitude to the assembly to be examined, according to the proposed architecture an adaptation of the excitation amplitude may be executed instantly via the adjustable impedance of the coupling circuit.

The features in their various forms disclosed in the above description, the enclosed claims and the enclosed Figures may both individually and in any combination be of importance and configured for realizing an embodiment.

Although some aspects have been described in connection with an apparatus, it is clear that these aspects also illustrate a description of the corresponding method, where a block or a device of an apparatus is to be understood as a corresponding method step or a feature of a method step. Analogously, aspects described in the context of or as a method step also represent a description of a corresponding block or detail or feature of a corresponding apparatus.

The above described embodiments are merely an illustration of the principles of the present invention. It is understood that modifications and variations of the arrangements and the details described herein will be apparent to others skilled in the art. It is the intent, therefore, that this invention is limited only by the scope of the impending patent claims and not by the specific details presented by way of description and explanation of the embodiments herein.

The invention claimed is:

1. An apparatus for frequency characterization of an electronic system, comprising:
   two terminals configured to couple with the electronic system;
   a control circuit configured to generate a test signal;
   a coupling circuit configured to couple the test signal into the electronic system, wherein the coupling circuit comprises an adjustable impedance and a switch which are coupled in series, wherein end nodes of the coupling circuit are coupled to the two terminals, and wherein the switch is configured to electrically couple the two terminals with each other based on the test signal; and
   a measurement circuit configured to generate a first measurement signal representing the current through the coupling circuit and/or a second measurement signal representing the voltage across the coupling circuit, wherein the control circuit is further configured to:

generate, based on the first measurement signal and the test signal, a first signal which represents a frequency course of the current through the coupling circuit; and/or generate, based on the second measurement signal and the test signal, a second signal which represents a frequency course of the voltage across the coupling circuit.

2. The apparatus according to claim 1, wherein the measurement circuit is further configured to generate the first measurement signal and/or the second measurement signal synchronous to the test signal.

3. The apparatus according to claim 1, wherein the test signal is a square wave signal.

4. The apparatus according to claim 1, wherein the test signal is a pseudo-random binary sequence.

5. The apparatus according to claim 4, wherein a measurement bandwidth of the measurement circuit is up to 50% of a sampling frequency of the test signal.

6. The apparatus according to claim 1, wherein the control circuit is further configured to set an impedance value of the adjustable impedance depending on an operating voltage and/or an operating current of the electronic system.

7. The apparatus according to claim 1, wherein the switch is a transistor and wherein the apparatus further comprises a driver which is configured to control the conductivity of the transistor based on the test signal.

8. A DC-DC converter, comprising
a voltage converter circuit configured to convert an input voltage with a first voltage level into an output voltage with a different second voltage level; and
an apparatus for frequency characterization of an electronic system, comprising at least two terminals configured to couple with the electronic system, a control circuit configured to generate a test signal and a coupling circuit comprising an adjustable impedance and a switch which are coupled in series, wherein end nodes of the coupling circuit are coupled to the two terminals, and wherein the switch is configured to electrically couple the two terminals with each other based on the test signal,
wherein the two terminals of the apparatus are coupled to input terminals of the DC-DC converter which receive the input voltage or to output terminals of the DC-DC converter which output the output voltage.

9. The DC-DC converter according to claim 8, wherein the apparatus for frequency characterization is further configured to output an impedance signal representing an impedance at the input terminals or the output terminals of the DC-DC converter and wherein the voltage converter circuit is configured to:
set a control parameter based on the impedance signal; and/or
execute a safety routine based on the impedance signal.

10. A method for frequency characterization of an electronic system, comprising:
coupling a test signal into the electronic system using an apparatus for frequency characterization of an electronic system, comprising at least two terminals configured to couple with the electronic system, a control circuit configured to generate a test signal and a coupling circuit comprising an adjustable impedance and a switch which are coupled in series, wherein end nodes of the coupling circuit are coupled to the two terminals, and wherein the switch is configured to electrically couple the two terminals with each other based on the test signal;
measuring a first current and/or a first voltage at the electronic system to generate at least one measurement result;
cross-correlating the at least one measurement result with the test signal to generate a first correlation result; and
Fourier-transforming the first correlation result to generate a first course signal representing a frequency course of the current and/or the voltage.

11. The method according to claim 10, wherein the method further comprises:
measuring a second current and/or a second voltage at the electronic system to generate at least a second measurement result;
cross-correlating the at least one second measurement result with the test signal to generate a second correlation result; and
Fourier-transforming the second correlation result to generate a second course signal representing a frequency course of the second current and/or the second voltage.

12. The method of claim 10, wherein the first current and/or the first voltage are measured using the apparatus for frequency characterization.

13. The method of claim 10, wherein the test signal is a pseudo-random binary sequence and wherein the first current and/or the first voltage are measured with a measurement bandwidth of up to 50% of a sampling frequency of the test signal.

* * * * *